US012621612B2

(12) United States Patent
Dagher

(10) Patent No.: US 12,621,612 B2
(45) Date of Patent: May 5, 2026

(54) METHOD FOR MANUFACTURING A LOW-NOISE ELECTROACOUSTIC TRANSDUCER

(71) Applicant: COMMISSARIAT À L'ENERGIE ATOMIQUE ET AUX ENERGIES ALTERNATIVES, Paris (FR)

(72) Inventor: Samer Dagher, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 447 days.

(21) Appl. No.: 18/158,911

(22) Filed: Jan. 24, 2023

(65) Prior Publication Data

US 2023/0247372 A1 Aug. 3, 2023

(30) Foreign Application Priority Data

Jan. 28, 2022 (FR) ...................................... 2200754

(51) Int. Cl.
| | |
|---|---|
| *B81C 1/00* | (2006.01) |
| *B81B 3/00* | (2006.01) |
| *H04R 19/04* | (2006.01) |
| *H04R 31/00* | (2006.01) |

(52) U.S. Cl.
CPC ............. *H04R 19/04* (2013.01); *B81B 3/007* (2013.01); *B81C 1/00658* (2013.01); *H04R 31/00* (2013.01); *B81B 2201/0257* (2013.01); *B81B 2203/0127* (2013.01); *B81B 2203/0315* (2013.01); *B81C 2201/0109* (2013.01); *B81C 2201/0133* (2013.01); *H04R 2201/003* (2013.01)

(58) Field of Classification Search
CPC .. H04R 19/04; H04R 31/00; H04R 2201/003;

H04R 7/10; H04R 31/006; H04R 19/005; B81B 3/007; B81B 2201/0257; B81B 2203/0127; B81B 2203/0315; B81C 1/00658; B81C 2201/0109; B81C 2201/0133
See application file for complete search history.

(56) References Cited

U.S. PATENT DOCUMENTS

| | | | |
|---|---|---|---|
| 5,456,111 | A | 10/1995 | Hulsing, II |
| 11,661,336 | B2 * | 5/2023 | Joet ...................... H04R 31/003 |
| | | | 381/150 |
| 2012/0260500 | A1 | 10/2012 | Zhou |

FOREIGN PATENT DOCUMENTS

| | | | |
|---|---|---|---|
| EP | 2 541 222 | A1 | 1/2013 |
| FR | 3 059 659 | A1 | 6/2018 |
| FR | 3 114 584 | B1 | 9/2022 |

OTHER PUBLICATIONS

Search Report as issued in French Patent Application No. 2200754, dated Sep. 19, 2022.

* cited by examiner

*Primary Examiner* — Herve-Louis Y Assouman
(74) *Attorney, Agent, or Firm* — CUSHMAN PARTNERS, LLC

(57) ABSTRACT

A method for manufacturing an electroacoustic transducer includes a frame; an element movable relative to the frame, the movable element including a membrane and a membrane rigidifying structure; a first transmission arm, the movable element being coupled to one end of the first transmission arm; in which method the membrane of the movable element is moved away from the frame by using a sacrificial layer of greater thickness at least at the periphery of the membrane.

18 Claims, 7 Drawing Sheets

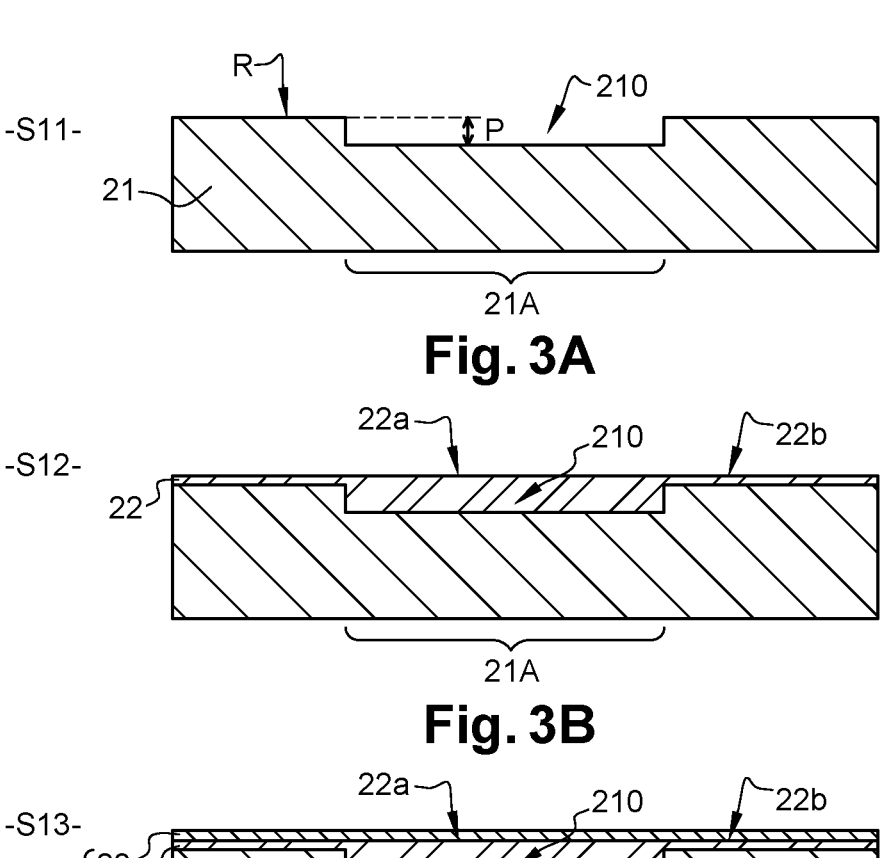
Fig. 3A
Fig. 3B
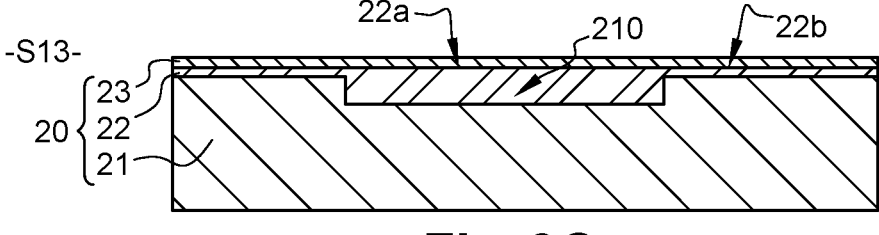
Fig. 3C
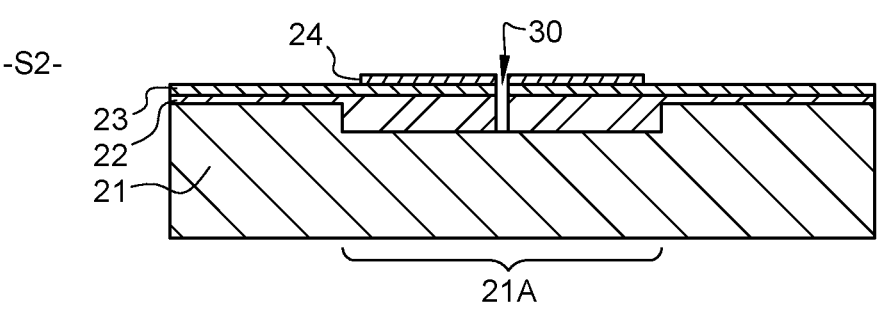
Fig. 3D
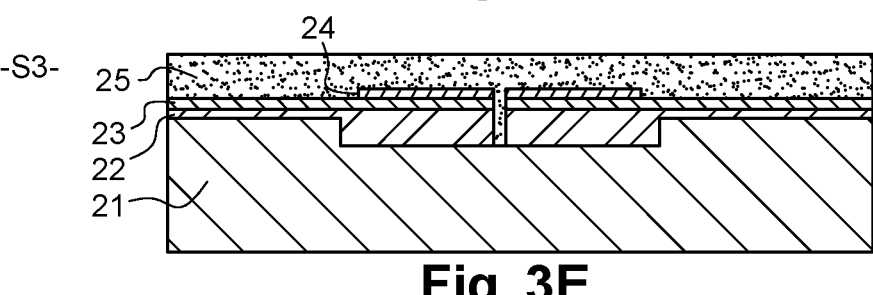
Fig. 3E

METHOD FOR MANUFACTURING A LOW-NOISE ELECTROACOUSTIC TRANSDUCER

CROSS-REFERENCE TO RELATED APPLICATIONS

This application claims priority to French Patent Application No. 2200754, filed Jan. 28, 2022, the entire content of which is incorporated herein by reference in its entirety.

FIELD

The technical field of the invention is that of microelectromechanical system (MEMS) or nanoelectromechanical system (NEMS) type devices. The invention more particularly relates to a method for manufacturing an electroacoustic transducer comprising a device for transmitting movement and force between two zones that are sealingly insulated from each other. Such an electroacoustic transducer can be employed as a microphone or loudspeaker.

BACKGROUND

Microelectromechanical or nanoelectromechanical microphones represent a rapidly expanding market, particularly by virtue of the development of nomadic devices, such as tablets, smartphones and other connected objects, wherein they are gradually replacing electret microphones.

Microphones measure a rapid change in atmospheric pressure, also known as acoustic pressure. They therefore have at least one part in contact with the outside.

Most MEMS or NEMS microphones manufactured today are capacitive detection microphones. Patent application FR3059659 describes an example of a capacitive detection microphone comprising a movable element, capacitive detection means and a device for transmitting movement between the movable element and the capacitive detection means.

The movable element is capable of collecting the pressure variation. It can be formed by a rigid piston comprising a membrane, also called a thin film, and a membrane rigidifying structure. The membrane forms a separation between a cavity open to the external environment and a back volume of the microphone, also called a reference volume because a reference pressure prevails therein. Thus, one face of the membrane is subjected to the reference pressure, and the opposite face of the membrane is subjected to the atmospheric pressure (whose variation is desired to be detected). The movable element is connected to the movement transmission device in a first zone of the microphone.

The capacitive detection means allow the displacement of the piston, and thus the variation in pressure, to be measured. They are arranged in a second zone that is sealingly insulated from the first zone. They comprise a movable electrode and at least one fixed electrode arranged facing the movable electrode. The electrodes form the plates of a capacitor whose capacitance varies as a function of the displacement of the piston. The second zone is a controlled atmosphere (typically under vacuum) chamber to reduce viscous friction phenomena and associated noise.

The transmission device comprises at least one first transmission arm extending in the first zone and at least one second transmission arm extending in the second zone. The piston is coupled to a first end of the first transmission arm, while the movable electrode of the capacitive detection means is coupled to one end of the second transmission arm.

The first and second transmission arms are connected at their second end via a pivot hinge. This pivot hinge allows rotation of the transmission arms relative to the microphone frame and simultaneously ensures sealing of the first and second zones.

Such a capacitive detection microphone may suffer from squeeze-film damping, which is caused by air being squeezed between the piston and the frame upon operating the microphone. Squeeze-film damping generates mechanical noise and leads to a decrease in microphone performance.

SUMMARY

More generally, there is a need to manufacture an electroacoustic transducer in which the damping phenomenon is reduced, the electroacoustic transducer comprising:
- a frame;
- an element movable relative to the frame, the movable element comprising a membrane and a membrane rigidifying structure;
- a first transmission arm, the movable element being coupled to one end of the first transmission arm.

According to a first aspect of the invention, this need tends to be satisfied by providing a manufacturing method comprising the following steps of:
- forming a first sacrificial layer on a substrate, the first sacrificial layer comprising a first portion and a second portion adjacent to the first portion, the first portion having a greater thickness than the second portion;
- forming a first structural layer on the first sacrificial layer;
- forming a second sacrificial layer on the first structural layer;
- forming a second structural layer on the first structural layer and on the second sacrificial layer;
- etching the second structural layer so as to expose the second sacrificial layer and to delimit the rigidifying structure of the movable element;
- etching the first structural layer up to the first sacrificial layer so as to delimit the membrane of the movable element, a peripheral portion of the membrane being arranged facing the first portion of the first sacrificial layer;
- etching the second sacrificial layer so as to expose a first face of the membrane;
- etching the substrate so as to delimit the first transmission arm, the first sacrificial layer acting as a stop layer to etching of the substrate; and
- etching the first sacrificial layer so as to expose a second, opposite face of the membrane.

The first portion of the first sacrificial layer, which is thicker than the second portion, makes it possible to increase the distance between the substrate and the membrane of the movable element, thus reducing the squeeze-film damping phenomenon responsible for mechanical noise.

In an embodiment, the manufacturing method comprises, prior to the step of forming the first sacrificial layer, a step of etching a cavity into the substrate, the first portion of the first sacrificial layer completely filling the cavity, and the second portion of the first sacrificial layer being arranged outside the cavity.

The first structural layer can be formed by epitaxy on the first sacrificial layer.

Alternatively, the step of forming the first structural layer comprises the following substeps of:
- providing a transfer substrate comprising the first structural layer;

bonding the first structural layer of the transfer substrate to the first sacrificial layer;

thinning the transfer substrate until the first structural layer is reached.

The manufacturing method may further comprise, after the step of etching the second sacrificial layer and before the step of etching the substrate, the following steps of:

arranging a cap on the second structural layer, thereby forming an assembly; and turning over the assembly.

In addition to the characteristics just discussed in the preceding paragraphs, the manufacturing method according to one or more embodiments of the invention may have one or more of the following additional characteristics, considered individually or according to any technically possible combinations:

the cavity has a depth greater than or equal to 1 μm, such as between 2 μm and 10 μm;

the cavity is annular in shape and, in an embodiment, extends over more than 80% of the periphery of the movable element;

the cavity and the membrane are of the same, in an embodiment rectangular, shape;

the cavity has dimensions greater than or equal to the dimensions of the membrane;

the first structural layer and the second structural layer are simultaneously etched so as to delimit the membrane and the rigidifying structure of the movable element;

the substrate is of silicon, the first sacrificial layer is of silicon oxide and the first structural layer is of silicon;

the second sacrificial layer is of silicon oxide;

the first structural layer has a thickness of between 100 nm and 10 μm;

the rigidifying structure of the movable element at least partly rests on the membrane; and the rigidifying structure of the movable element is in contact with the membrane.

A second aspect of the invention relates to an electroacoustic transducer comprising:

a frame;

an element movable relative to the frame, the movable element comprising a membrane and a membrane rigidifying structure;

a first transmission arm, the movable element being coupled to one end of the first transmission arm;

the membrane being formed by a first portion of a first structural layer, the rigidifying structure being formed by a first portion of a second structural layer arranged on the first structural layer, and the frame comprising a substrate, a second portion of the first structural layer and a second portion of the second structural layer, and wherein the distance between the substrate and a peripheral portion of the membrane is greater than the distance between the substrate and the second part of the first structural layer.

In an embodiment of the electroacoustic transducer, the substrate comprises a cavity arranged facing the peripheral portion of the membrane.

The transducer may further comprise a device for transmitting movement and force between a first zone and a second zone with a controlled atmosphere, the first and second zones being sealingly insulated from each other, the transmission device comprising, in addition to the first transmission arm extending in the first zone, a second transmission arm extending in the second zone.

The invention and its various applications will be better understood upon reading the following description and examining the accompanying figures.

BRIEF DESCRIPTION OF THE FIGURES

Further characteristics and benefits of the invention will become clearer from the description thereof given below, by way of indicating and not in any way limiting purposes, with reference to the appended figures, among which:

FIG. 3A to FIG. 3J represent, in a cross-sectional view, steps of a method for manufacturing an electroacoustic transducer according to an embodiment of the invention, repeating the steps of FIGS. 2B to 2H.

For the sake of clarity, identical or similar elements are marked with identical reference signs throughout the figures.

DETAILED DESCRIPTION

Figure 1:
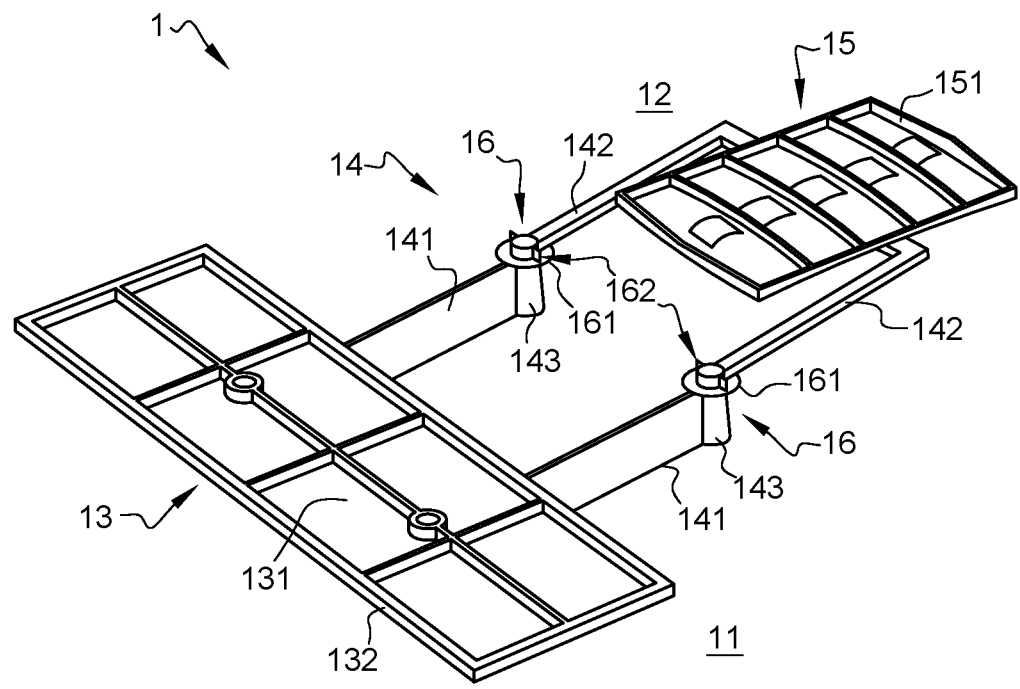
FIG. 1 schematically and partially represents an example of an electroacoustic transducer comprising a piston connected to two first transmission arms.

FIG. 1 represents an example of an electroacoustic transducer 1, of the capacitive detection microphone type.

The electroacoustic transducer 1 comprises a frame (not represented) at least partly delimiting a first zone 11 and a second zone 12, an element 13 movable relative to the frame and a device 14 for transmitting movement between the first zone 11 and the second zone 12. The first and second zones 11-12 of the electroacoustic transducer 1 are subjected to different pressures. They are sealingly insulated from each other.

The movable element 13, hereinafter referred to as the piston, is in contact with the first zone 11. It comprises a membrane 131 and a membrane rigidifying structure 132, also referred to as a skeleton or armature. The role of the membrane 131 of the piston 13 is to collect over its entire surface a pressure difference between its two faces, in order to deduce a variation in atmospheric pressure therefrom.

The membrane 131 of the piston 13 partly delimits a closed reference volume, where a reference pressure prevails. It separates this reference volume from a cavity open to the external environment, in this case air. One face of the membrane 131 is therefore subjected to the reference pressure, and the opposite face of the membrane 131 is subjected to the atmospheric pressure (whose variation is desired to be detected in the case of a microphone).

The first zone 11 may correspond to the cavity open to the external environment, and thus be subjected to atmospheric pressure. Alternatively, the first zone 11 may be the reference volume subjected to the reference pressure.

Furthermore, in this particular example, the electroacoustic transducer 1 comprises a capacitive detection system 15 arranged in the second zone 12. This capacitive detection system 15 makes it possible to measure the displacement of the piston 13, and therefore the pressure difference between its two faces. In an embodiment, the system comprises a movable electrode 151 and at least one fixed electrode arranged facing the movable electrode 151. The electrodes form the plates of a capacitor whose capacitance varies according to the displacement of the piston 13.

The second zone 12 is a controlled atmosphere chamber to reduce viscous friction phenomena and associated acoustic noise. By "controlled atmosphere chamber", it is meant a chamber under reduced pressure, typically less than 10 mbar, and in an embodiment under vacuum.

The transmission device 14 is rotatably movably mounted to the frame by one or more pivot hinges 16. The transmission device 14 comprises at least one first transmission arm 141 extending in the first zone 11, at least one second transmission arm 142 extending in the second zone 12 and at least one transmission shaft 143 extending partly in the first zone 11 and partly in the second zone 12. In the example of FIG. 1, the transmission device 14 comprises two first transmission arms 141, two second transmission arms 142 and two transmission shafts 143, each transmission shaft 143 connecting a first transmission arm 141 to a second transmission arm 142.

Each first transmission arm 141 comprises a first end coupled to the piston 13 and a second, opposite end coupled to the associated transmission shaft 143. Each second transmission arm 142 comprises a first end coupled to the movable electrode 151 of the capacitive detection system 15 and a second, opposite end coupled to the associated transmission shaft 143.

The transmission shaft 143 is for example shaped as a straight cylinder. The transmission arms 141-142 have the shape of a beam with a rectangular cross-section, with one dimension (length) much larger than the others (width and thickness). For example, the piston 13 has a rectangular shape. The first transmission arms 141 extend perpendicular to one side of the piston 13, beneficially a long side. They may be anchored within the periphery of the piston 13, as is represented in FIG. 1, for example by a first cylindrically shaped end.

Each pivot hinge 16 comprises a sealed insulation element 161, through which a transmission shaft 143 passes, and two aligned blades 162, which extend between the transmission shaft 143 and the frame. The sealed insulation element 161 is, for example, in the form of a sealing membrane. It ensures sealing between the first zone 11 and the second zone 12 at the pivot hinge 16. The blades 162 are dimensioned so as to be translationally deformed and to allow rotation of the transmission device 14. They are in an embodiment arranged diametrically opposite to the transmission shaft 143. In an embodiment, the sealed insulation element 161 is such that it also deforms under the effect of the rotational displacement of the transmission device 14.

The frame may especially comprise a support (formed by a first substrate), a structural layer (for example of silicon) arranged on the support and a cap assembled to the structural layer (e.g. formed by a second substrate).

The membrane rigidifying structure 132 of the piston 13 beneficially comprises at its periphery a rim which extends in a direction perpendicular to the membrane 131. This rim increases the air path around the piston and reduces leakage between the external environment and the closed volume acting as a reference.

FIGS. 2A to 2H represent steps S1 to S8 of a method for manufacturing the electroacoustic transducer 1. These figures show how the piston 13 can be formed and detached from the frame. Only a part of the electroacoustic transducer, in the vicinity of the periphery of the piston 13, is therefore represented. For the sake of simplicity, reference will be made to only one first transmission arm 141, one pivot hinge 16, one sealing membrane 161 . . . , it being understood that all elements of the same type can be simultaneously formed.

Figure 2A:
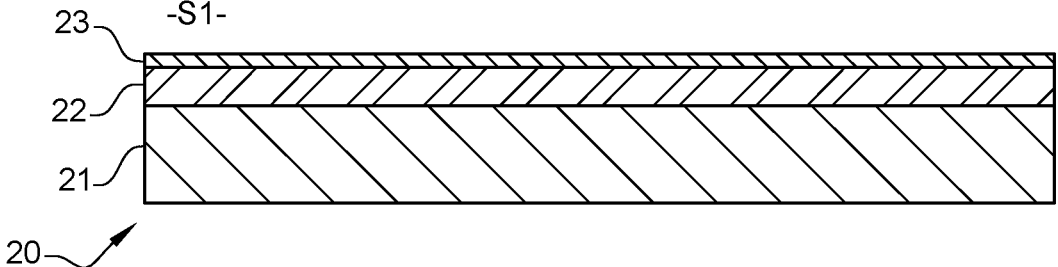
FIG. 2A to FIG. 2H represent, in a cross-sectional view, steps of a method for manufacturing the electroacoustic transducer according to FIG. 1.

The first step S1 represented in FIG. 2A consists in providing a stack of layers 20 as a starting material for making the transducer. The stack 20 successively comprises a substrate 21, a first sacrificial layer 22 and a first structural layer 23, also called "thin layer".

The substrate 21 is used in particular to make the first transmission arm 141 and part of the frame (the support). It initially has a thickness which may be between 500 μm and 700 μm. The substrate 21 can be made of a semiconductor material, for example silicon.

The first structural layer 23 is used to form the membrane 131 of the piston 13. It can also be used to make the sealing membrane 161 of the pivot hinge 16 and/or the movable electrode 151 of the capacitive detection system 15. It has a thickness less than that of the substrate 21, in an embodiment between 100 nm and 10 μm, for example equal to 1 μm. It is in an embodiment made of the same material as the substrate, for example silicon.

The first sacrificial layer 22 is to partly disappear upon making the transducer. This layer is particularly useful for delimiting the first transmission arm 141. It can also serve as a lower air gap in the capacitive detection zone of the transducer. It may also serve to mechanically connect the substrate 21 and the first structural layer 23. The first sacrificial layer 22 may be made of a dielectric material, in an embodiment a silicon nitride or a silicon oxide, for example silicon dioxide ($SiO_2$). Its thickness is for example between 100 nm and 10 μm.

The stack 20 can especially be a multilayer structure of the Silicon On Insulator (SOI) type, commonly known as an SOI substrate.

Although not represented in the figures, the manufacturing method may then include a step of etching the first structural layer 23. This step of etching the first structural layer 23 may especially serve to form release holes for the movable electrode 151 (to allow the etching solution of the first sacrificial layer 22 to infiltrate later).

Figure 2B:
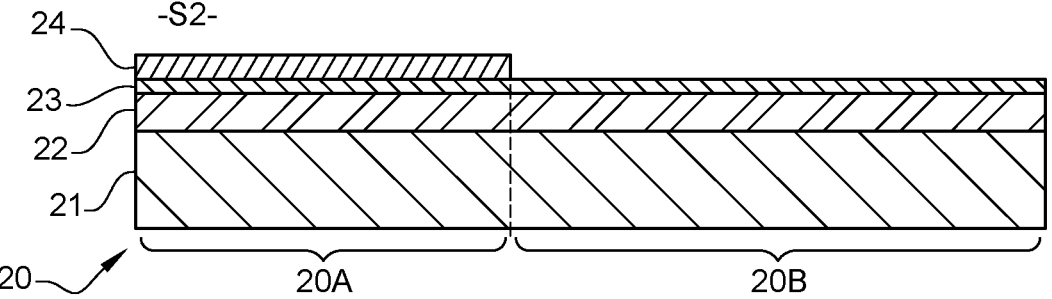

In step S2 of FIG. 2B, a second sacrificial layer 24 is formed on the first structural layer 23 in a first region 20A of the stack 20. To do this, the second sacrificial layer 24 may first be deposited to fully cover the first structural layer 23, and then partially etched in a second zone 20B of the stack 20, for example through a photolithographically formed resin mask. The first and second zones 20A-20B of the stack 20 are adjacent. Etching of the second sacrificial layer 24 is in an embodiment selective with respect to the first structural layer 23. The second sacrificial layer 24 is beneficially formed by the same dielectric material as the first sacrificial layer 22, for example a silicon oxide. Its thickness may be between 100 nm and 10 μm.

The second sacrificial layer 24 may act as an upper air gap for capacitive detection. Etching the second sacrificial layer 24 may result in etching the first sacrificial layer 22, where the first structural layer 23 has previously been etched (not represented in the figures).

Figure 2C:
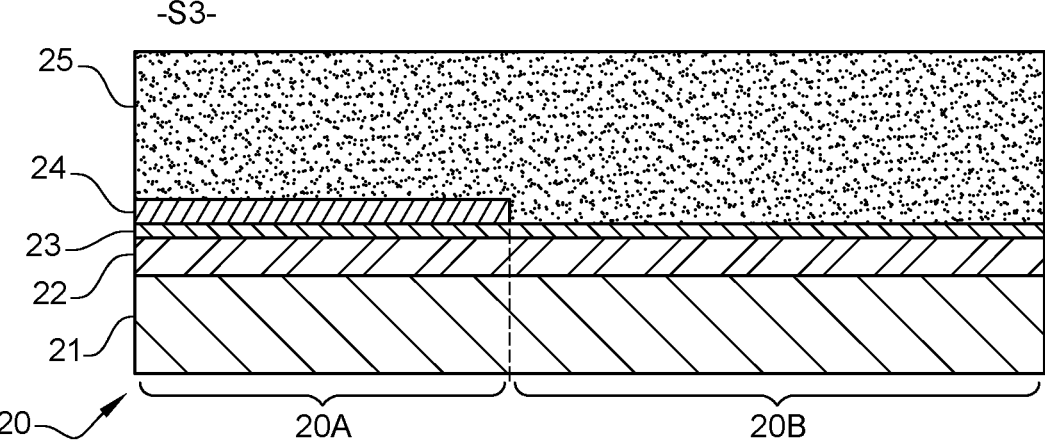

In step S3 of FIG. 2C, a second structural layer 25 is deposited onto the first structural layer 23 (in the second zone 20B of the stack 20) and onto the second sacrificial layer 24 (in the first zone 20A of the stack 20), for example by epitaxy. The second structural layer 25 is to form one or more (structural) elements of the transducer, in particular the rigidifying structure 132 of the piston 13. It is beneficially formed by the same material as the first structural layer 23, for example silicon. The thickness of the second structural layer 25 is in an embodiment between 5 μm and 50 μm, for example 20 μm.

Figure 2D:
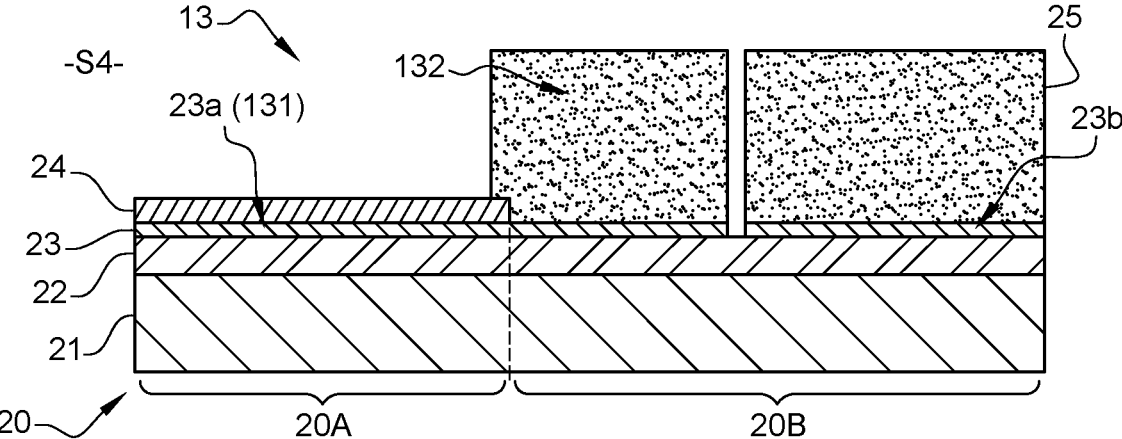

Then, in a step S4 represented by FIG. 2D, the second structural layer 25 is etched so as to delimit contours of the rigidifying structure 132 (trimming of the piston) and to lighten the piston 13. In the first zone 20A of the stack 20, the second sacrificial layer 24 (e.g. of silicon oxide) serves as a stop layer to etching of the second structural layer 25 (e.g. of silicon), thus preserving the underlying first structural layer 23 (e.g. of silicon). Etching of the second structural layer 25 is thus selective with respect to the second sacrificial layer 24. In contrast, in the second zone 20B of the stack 20, etching of the second structural layer 25 to delimit the periphery (or external contour) of the rigidifying structure 132 opens onto the first structural layer 23. As etching of the second structural layer 25 is not selective with respect to the first structural layer 23 (but only with respect to the first sacrificial layer 22), the first structural layer 23 is etched at the same time as the second structural layer 25 up to the first sacrificial layer 22.

Thus, at the bottom of the trench corresponding to the periphery of the rigidifying structure 132, the first structural layer 23 has been etched and the first sacrificial layer 22 is exposed.

At the end of step S4, the first structural layer 23 comprises a first part 23a and a second part 23b separated from each other. The first part 23a of the first structural layer 23 (on the left in FIG. 2D) is to form the membrane 131 of the piston 13. It is covered with the second sacrificial layer 24 and by a separate portion of the second structural layer 25 forming the rigidifying structure 132 of the piston 13.

The etching technique employed in step S4 of FIG. 2D is beneficially Deep Reactive Ion Etching (DRIE).

Figure 2E:
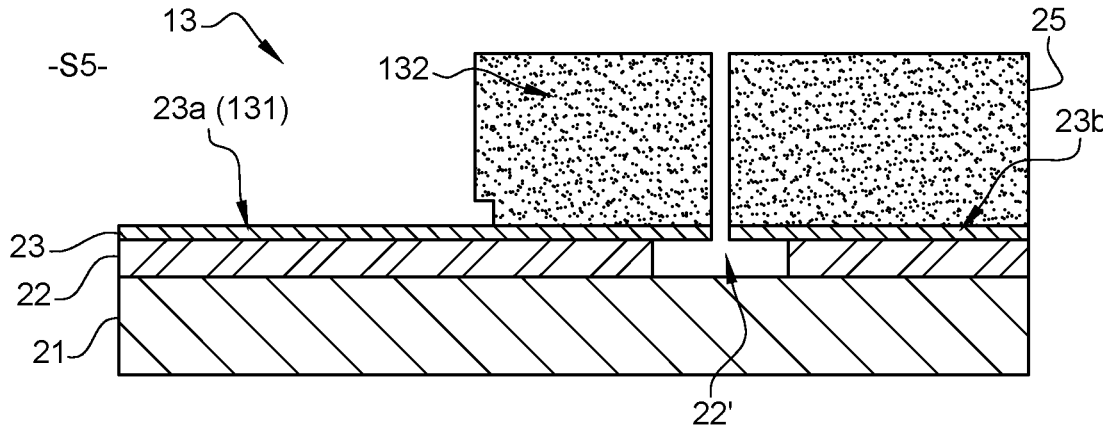

With reference to FIG. 2E, the manufacturing method then comprises a step S5 of etching the second sacrificial layer 24 so as to (partially) expose the first portion 23a of the first structural layer 23 (in other words so as to expose a first face of the membrane 131). This step S5 can be referred to as the first step of releasing the piston 13.

Etching of the second sacrificial layer 24 is in an embodiment isotropic etching selective with respect to the substrate 21, the first structural layer 23 and the second structural layer 25. The second sacrificial layer 24 is in an embodiment chemically etched, for example by immersing the stack in a hydrofluoric acid (HF) bath in the liquid or vapour phase (in the case of a silicon oxide layer) for a controlled time.

In contrast, a portion of the first sacrificial layer 22 located in vertical alignment with the periphery of the rigidifying structure 132 is etched at the same time as the second sacrificial layer 24, forming a cavity 22' in the first sacrificial layer 22. Etching can be controlled in time so that this cavity 22' is of low extension.

Etching of the sacrificial layers 22 and 24 can also be used to release the movable electrode 151 from the capacitive detection system 15 (before it is enclosed in the controlled atmosphere chamber).

Although not represented in the figures, the manufacturing method may then comprise a step S6 of transferring a cap onto the second structural layer 25, thereby forming a controlled atmosphere chamber, that is the second zone 12. The cap may be made by machining a silicon substrate. It can be especially attached to the second structural layer 25 by direct bonding (e.g. Si—Si) or by eutectic sealing (e.g. Au—Si or Al—Ge).

Figure 2F:
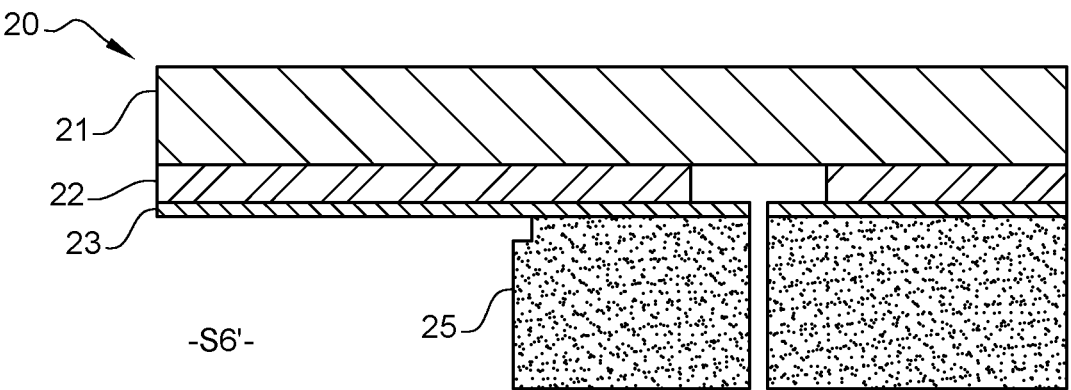

Then, in step S6' of FIG. 2F, the assembly formed by the stack of layers 20 and the cap (not represented) is turned over, to facilitate subsequent etching of the substrate 21. After this turning over, the substrate 21 is beneficially thinned, for example by DRIE etching, grinding and/or Chemical Mechanical Polishing (CMP), in an embodiment until a thickness of between 30 μm and 300 μm, that is the desired thickness for the first transmission arm 141, is reached.

Figure 2G:
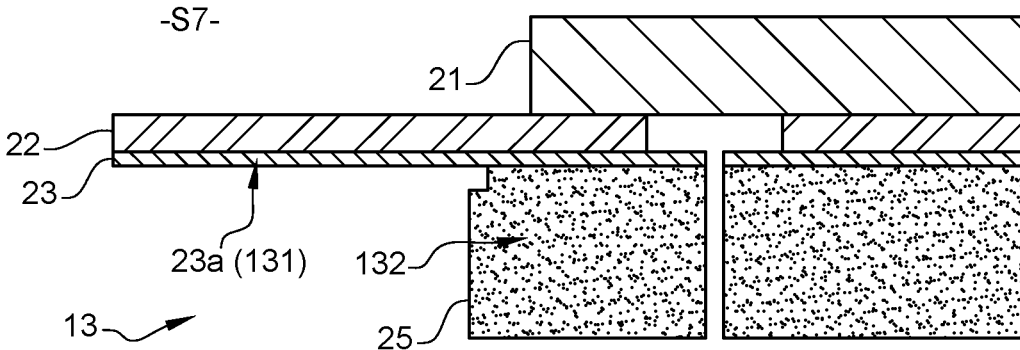

Step S7 of FIG. 2G consists in etching the substrate 21 (possibly thinned) up to the first sacrificial layer 22 so as to create access to the piston 13 and to delimit, in a zone not represented in FIG. 2G, the first transmission arm. Etching of the substrate is in an embodiment selective with respect to the first sacrificial layer 22. The substrate 21 can be etched by DRIE.

As is illustrated in FIG. 2G, etching of the substrate 21 to create access to the rear face of the piston 13 may be inscribed within the periphery of the piston 13, so as not to open into the cavity 22' formed in step S5 (see FIG. 2E) by the partial (and unintended) etching of the first sacrificial layer 22. Thus, etching of step S7 does not extend to the piston 13 comprising the first part 23a of the first structural layer 23 (membrane 131) and the separate portion of the second structural layer 25 (rigidifying structure 132). Within the periphery of the piston 13, the first sacrificial layer 22 (e.g. silicon oxide) serves as a stop layer to etching the substrate 21 (e.g. silicon), thereby preserving the first part 23a of the underlying first structural layer 23 (e.g. silicon). This avoids creating significant air leakage between the cavity open to the external environment (and thus subject to atmospheric pressure) and the reference volume (subject to the reference pressure), also known as the back volume, on either side of the membrane 131.

Finally, in step S8 (see FIG. 2H), the first sacrificial layer 22 is etched so as to uncover the first portion 23a of the first structural layer 23 (in other words so as to expose a second, opposite face of the membrane 131) and separate it from the substrate 21. At the end of step S8, the piston 13 is free to move. Step S8 can therefore be referred to as a second step of releasing the piston 13.

Etching of the first sacrificial layer 22 is in an embodiment isotropic etching selective with respect to the substrate 21, the first structural layer 23 and the second structural layer 25. The first sacrificial layer 22 is in an embodiment etched chemically, for example by immersing the assembly in a hydrofluoric acid (HF) bath in liquid or vapour phase (in the case of a silicon oxide layer) for a controlled time.

Figure 2H:
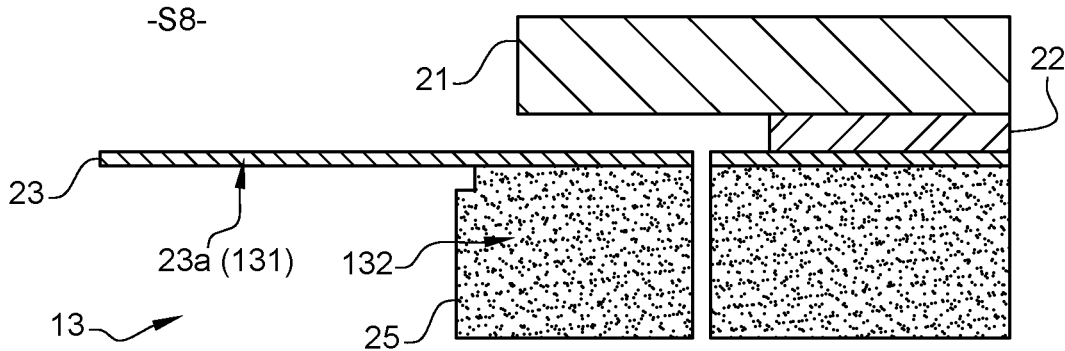

As the piston 13 moves, air is squeezed between the membrane 131 and the remaining portion of the substrate 21 over almost the entire periphery of the piston 13 (see FIG. 2H). This air squeezing is due to the fact that etching of the substrate 21 is inscribed within the periphery of the piston 13. It causes a damping phenomenon, known as "squeeze-film damping", which generates mechanical noise and leads to a decrease in the performance of the transducer. The strength of this damping phenomenon is inversely proportional to the cube of the distance (called "gap") between the piston 13 and the frame (here the remaining portion of the substrate 21).

FIGS. 3A to 3J illustrate modifications to the manufacturing method, allowing the damping phenomenon to be dramatically reduced.

Steps S11 to S13, illustrated in FIGS. 3A to 3C, aim to recreate the multilayer stack 20 comprising the substrate 21, the first sacrificial layer 22 and the first structural layer 23, but additionally providing it with a cavity 210 arranged on the surface of the substrate 21 and filled with the first sacrificial layer 22.

Thus, with reference to FIG. 3A, the manufacturing method starts with a step S11 of etching the cavity 210 in the substrate 21. The substrate 21 is in an embodiment a so-called bulk semiconductor substrate, for example of silicon. The cavity 210 is located in a region 21A of the substrate 21 dedicated to the formation of the piston 13. It has a depth P greater than or equal to 1 μm, in an embodiment between 2 μm and 10 μm. The depth P of the cavity 210 is measured from the initial surface of the substrate 21, hereinafter referred to as the reference surface R.

Then, in step S12 of FIG. 3B, the first sacrificial layer 22 is formed on the substrate 21. The first sacrificial layer 22 here comprises a first portion 22a completely filling the cavity 210, and a second portion 22b adjacent to the first portion 22a and arranged outside the cavity 210. The first portion 22a has a greater thickness than the second portion 22b.

The first sacrificial layer 22 beneficially has a planar surface. The thickness of the first portion 22a is then equal to the sum of the depth P of the cavity 210 and the thickness of the second portion 22b. The thickness of the second portion 22b of the first sacrificial layer 22 is for example between 100 nm and 10 μm.

The first sacrificial layer 22 is beneficially deposited in such a way as to completely fill the cavity 210 and to form an extra thickness on the reference surface R of the substrate 21. For example, the first sacrificial layer 22 is formed by Plasma Enhanced Chemical Vapour Deposition (or PECVD) followed by annealing. This deposition operation is beneficially followed by a planarisation operation, for example by Chemical Mechanical Polishing (CMP), in order to obtain the planar surface.

In step S13 of FIG. 3C, the first structural layer 23 is formed on the first sacrificial layer 22. The first structural layer 23 (which is as a reminder intended to form the membrane 131 of the piston 13) covers at least the first portion 22a of the first sacrificial layer 22. It is deposited so as to cover the first and second portions 22a-22b of the first sacrificial layer 22, as illustrated in FIG. 3C.

The first structural layer 23 can be formed in step S13 by epitaxially growing silicon on the first sacrificial layer 22, typically of SiO$_2$. The first structural layer 23 is thereby made of polycrystalline silicon.

Figure 4:
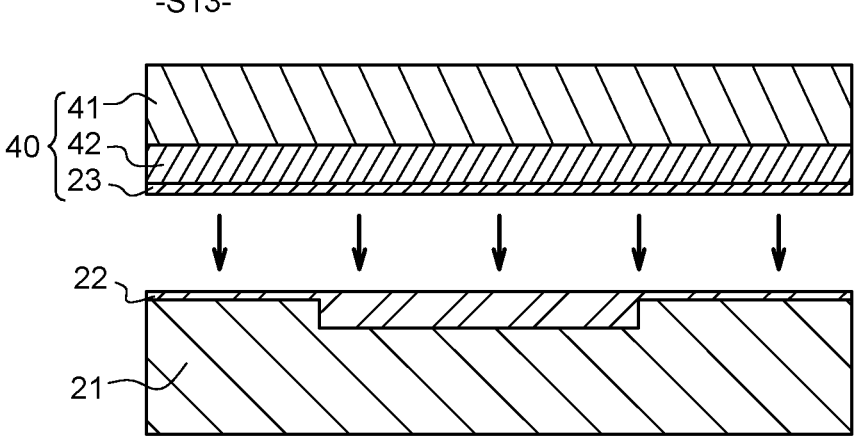
FIG. 4 represents an alternative embodiment of the step of FIG. 3C.

In an alternative embodiment of step S13 represented in FIG. 4, the first structural layer 23 initially belongs to a transfer substrate 40. It is transferred to the first sacrificial layer 22 using a direct bonding technique.

The transfer substrate 40 is bonded to the substrate 21 coated with the first sacrificial layer 22 by contacting the first structural layer 23 with the first sacrificial layer 22. Then, the transfer substrate 40 is thinned up to the first structural layer 23. Thinning of the transfer substrate 40 may be achieved by etching or CMP.

The transfer substrate 40 is in an embodiment a multilayer SOI type structure successively comprising a support layer 41 (typically of silicon), a buried oxide layer 42 (typically of SiO$_2$) and a thin film of single crystal silicon forming the first structural layer 23. The transfer substrate 40 is thinned by successively removing the support layer 41 and the buried oxide layer 42.

This alternative embodiment allows the formation of a first structural layer 23 of single crystal silicon, rather than polycrystalline silicon.

With reference to FIGS. 3D to 3J, the manufacturing method then comprises steps S2 to S8 previously described, in connection with FIGS. 2B to 2H.

FIG. 3D represents the step S2 of forming the second sacrificial layer 24 on the first structural layer 23. The second sacrificial layer 24 is formed only in the region 21A dedicated to the formation of the piston 13, in an embodiment in the manner described in connection with FIG. 2B ("full plate" deposition+etching).

FIG. 3E represents the step S3 of forming the second structural layer 25 (for forming the rigidifying structure 132 of the piston 13), for example by epitaxy. As previously described in connection with FIG. 2C, the second structural layer 25 covers both the second sacrificial layer 24 (in the region 21A) and the first structural layer 23.

Prior to the step S3 of forming the second structural layer 25, the manufacturing method may include a so-called step of opening the first structural layer 23 and the second sacrificial layer 24. This opening step consists in forming a well 30 that extends through the first structural layer 23 and the first sacrificial layer 22 to the substrate 21. This well 30 is formed by successively etching a portion of the first structural layer 23 and a portion of the first sacrificial layer 22, in an embodiment through the second sacrificial layer 24. The etched portions are located in region 21A (see FIG. 3D). The well 30 allows the material of the second structural layer 25 (for example silicon) to grow from the substrate 21 to the first structural layer 23, thus forming a pillar that passes through the first sacrificial layer 22. This pillar will provide connection between the membrane 131 of the piston 13 (formed in the first structural layer 23) and the first transmission arm 141 (formed in the substrate 21).

Figure 3F:
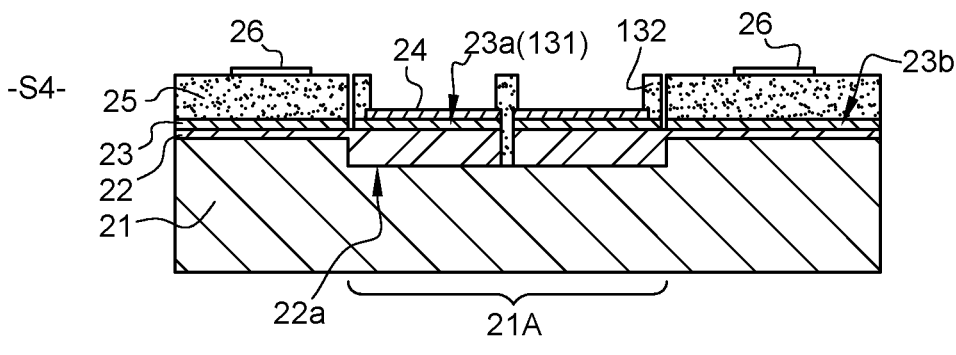

FIG. 3F represents the step S4 of etching the second structural layer 25, after it has been deposited onto the first structural layer 23 and the second sacrificial layer 24. The second structural layer 25 is etched so as to expose the second sacrificial layer 24 (piston lightening) and to delimit the rigidifying structure 132.

As previously described with reference to FIG. 2D, the first structural layer 23 can be etched in the same step S4 to delimit the membrane 131 (this is generally the case when the first structural layer 23 and the second structural layer 25 are made of the same material). The first structural layer 23 is thus separated into two portions: a first portion 23a forming the piston membrane 131 and a second portion 23b belonging to the transducer frame.

An alternative is to etch the second structural layer 25 and the first structural layer 23 separately, using different etching chemistries, when both layers are made of different materials.

Etching of the first structural layer 23 beneficially opens onto the first portion 22a of the first sacrificial layer 22.

Between the step S3 of forming the second structural layer 25 and the step S4 of etching the second structural layer 25, the manufacturing method may also include steps of depositing and patterning a germanium layer 26 onto the second sacrificial layer 25. The germanium layer 26 is in an embodiment formed at the periphery of the first region 21A.

In step S5 of FIG. 3G, the second sacrificial layer 24 is etched as described with reference to FIG. 2E (selective etching with respect to the substrate 21, the first structural layer 23 and the second structural layer 25), until it is completely removed. Simultaneously, a portion of the first sacrificial layer 22 is etched, starting from the bottom of the trench corresponding to the periphery of the membrane 131, thus forming the cavity 22'. The cavity 22' at least partly extends under the membrane 131.

Figure 3G:
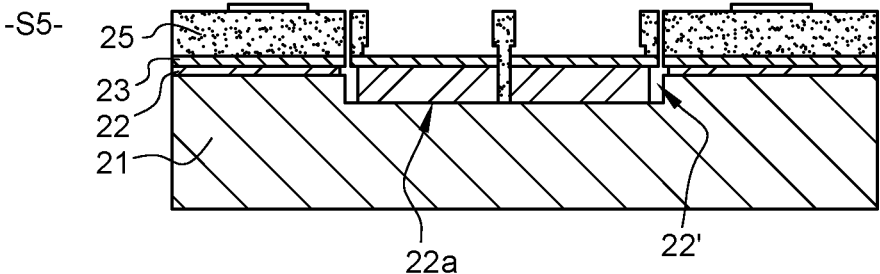

More particularly, etching of the second sacrificial layer 24 may extend to the first sacrificial layer portion 22a, as is illustrated in FIG. 3G.

Figure 3H:
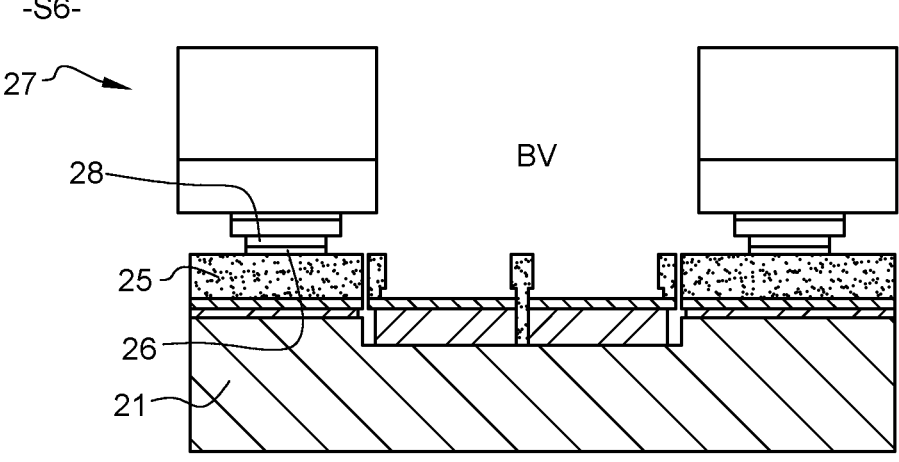

FIG. 3H represents the step S6 of transferring the cap 27 to the second structural layer 25, to form the controlled atmosphere chamber and, in this example, the back volume BV of the microphone.

The cap 27 can be covered with an aluminium layer 28 which is brought into contact with the germanium layer 26 in order to achieve aluminium-germanium eutectic seal bonding.

Figure 3I:
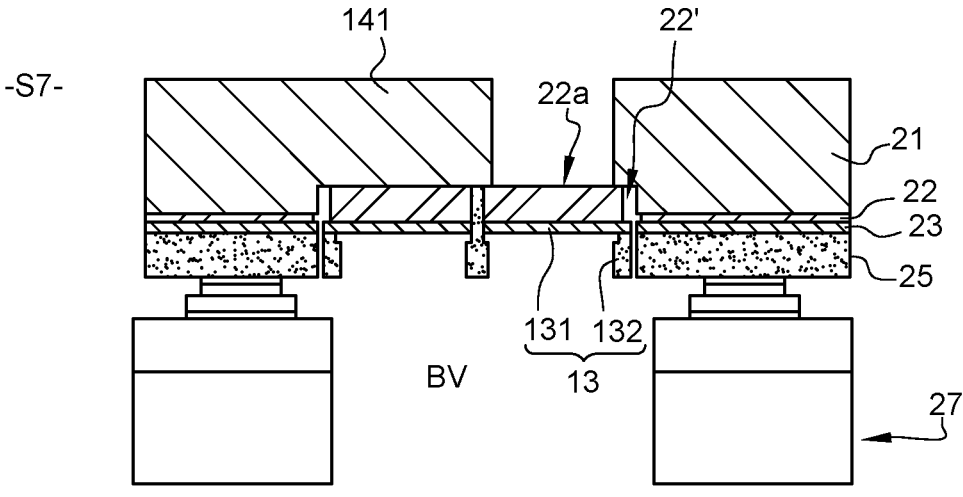

FIG. 3I represents the step S7 of etching the substrate 21 (after the step S6' of turning over the substrate 21 followed by a possible thinning of the substrate 21), for accessing the opposite face of the piston 13 and delimiting the first transmission arm 141. As in FIG. 2G, the substrate 21 is etched using the first sacrificial layer 22 as a stop layer. Etching of the substrate 21 is inscribed within the periphery of the piston 13, so that it does not open into the cavity 22'.

Figure 3J:
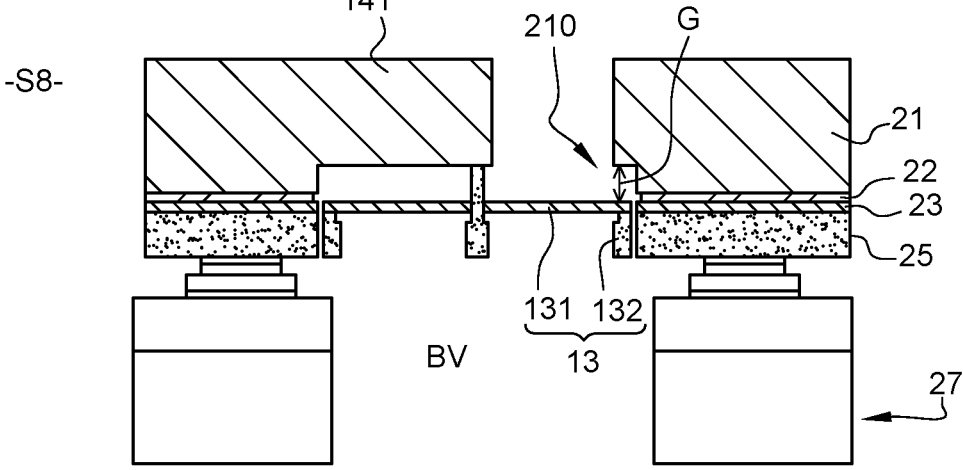

With reference to FIG. 3J, the manufacturing method is completed with the step S8 of etching the first sacrificial layer 22 (and more particularly its first portion 22a), as described in connection with FIG. 2H (second piston release step). The cavity 210 of the substrate 21 then becomes completely free again.

Air squeezing, which is a source of damping and therefore of noise, occurs between a peripheral portion of the membrane 131 and the substrate 21. To reduce the damping phenomenon, the cavity 210 formed in step S11 in the substrate 21 is configured so that the first portion 22a of the first sacrificial layer 22 is located facing the peripheral portion of the membrane 131 (portion in superimposition with the substrate 21). By "arranged facing", it is meant that the peripheral portion of the membrane 131 and the first portion 22a extend in front of each other, at least partly (in other words there is partial or total superimposition). The peripheral portion of the membrane 131 is in an embodiment covered with the rigidifying structure 132. The width of the peripheral portion is for example between 2 μm and 15 μm.

Such a configuration makes it possible to obtain (after step S8 of etching the second sacrificial layer 22; see FIG. 3J) a larger gap G between the membrane 131 of the piston 13 and the remaining part of the substrate 21, in comparison with the situation where the first sacrificial layer 22 is of constant thickness (FIG. 2H). The damping phenomenon, due to air squeezing, is therefore significantly reduced.

In other words, the substrate 21 and the peripheral portion of the membrane 131 are separated by a distance (gap G) greater than the distance between the substrate 21 and the second part 23b of the first structural layer 23. These distances are measured perpendicular to the faces of the membrane 131.

Forming the cavity 210 results in locally thickening the first sacrificial layer 22. Using a first sacrificial layer 22 with a higher thickness in the region 21a of the substrate dedicated to the formation of the piston 13 (or at least facing the peripheral portion of the membrane 131) is a more beneficial solution than increasing the thickness of the entire first sacrificial layer 22, as it does not impact manufacture of other parts of the microphone (which make use of this first sacrificial layer 22), such as the capacitive detection system.

The cavity 210 of the substrate 21 (and thus the first portion 22a of the first sacrificial layer 22) may be annular in shape. It is then sized so as to extend facing the peripheral portion of the membrane 131. The annular shape cavity 210, in an embodiment, extends over more than 80% of the periphery of the piston 13, beneficially over the entire periphery of the piston 13.

Alternatively, the cavity 210 may have the same shape as the membrane 131, for example a rectangular shape (see FIG. 1).

To minimise damping as much as possible, the dimensions of the cavity 210 (external dimensions in the case of an annular cavity 210) are beneficially greater than or equal to that of the membrane 131.

The first sacrificial layer 22 comprising the first and second portions 22a-22b (the first portion 22a being thicker than the second portion 22b) can be formed without first etching a cavity in the substrate, in other words starting from a substrate 21 with a planar surface. For example, the (sacrificial) material which makes up the first sacrificial layer 22 is first deposited as a layer of constant thickness, and then part of this layer is thinned, in an embodiment by etching, to form the second portion 22b (the unthinned part of the layer forming the first portion 22a).

The method for manufacturing an electroacoustic transducer according to the invention has been described taking as an example a microphone with capacitive detection (FIG. 1), one face of which is subjected to atmospheric pressure and the other face to a reference pressure. The manufacturing method described in connection with FIGS. 3A-3J, however, is applicable to other types of microphone and other types of electroacoustic transducer, in particular a loudspeaker (sound emitter) or an ultrasound emitter.

More generally, a microphone comprises in the second zone 12 (controlled atmosphere chamber) a system adapted to measure a movement of the transmission device and/or a force applied to the transmission device. This measurement system comprises for example a vibrating beam (resonant detection microphone).

In the case of a loudspeaker or ultrasonic transmitter, an actuator (for example capacitive actuator) replaces the measurement system in the second zone 22. The actuator moves the first end of the second transmission arm 142. This movement is transmitted by the transmission device 14 to the piston 13 which is integral with the first end of the first transmission arm 141. The movement of the membrane 131 of the piston 13 enables the emission of sound (or ultrasound).

The invention claimed is:

1. A method for manufacturing an electroacoustic transducer comprising:

a frame;

an element movable relative to the frame, the movable element comprising a membrane and a membrane rigidifying structure;

a first transmission arm, the movable element being coupled to one end of the first transmission arm;

the method comprising:

forming a first sacrificial layer on a substrate, the first sacrificial layer comprising a first portion and a second portion adjacent to the first portion, the first portion having a greater thickness than the second portion;

forming a first structural layer on the first sacrificial layer;

forming a second sacrificial layer on the first structural layer;

forming a second structural layer on the first structural layer and on the second sacrificial layer;

etching the second structural layer so as to expose the second sacrificial layer and to delimit the rigidifying structure of the movable element;

etching the first structural layer up to the first sacrificial layer so as to delimit the membrane of the movable element, a peripheral portion of the membrane being arranged facing the first portion of the first sacrificial layer;

etching the second sacrificial layer so as to expose a first face of the membrane;

etching the substrate so as to delimit the first transmission arm, the first sacrificial layer acting as a stop layer to etching of the substrate; and etching the first sacrificial layer so as to expose a second, opposite face of the membrane.

2. The method according to claim 1, comprising, prior to forming the first sacrificial layer, etching a cavity in the substrate, the first portion of the first sacrificial layer completely filling the cavity, and the second portion of the first sacrificial layer being arranged outside the cavity.

3. The method according to claim 2, wherein the cavity has a depth greater than or equal to 1 μm.

4. The method according to claim 3, wherein the depth is between 2 μm and 10 μm.

5. The method according to claim 2, wherein the cavity has an annular shape.

6. The method according to claim 5, wherein the cavity extends over more than 80% of a periphery of the movable element.

7. The method according to claim 2, wherein the cavity and the membrane are of the same shape.

8. The method according to claim 7, wherein the shape is rectangular.

9. The method according to claim 2, wherein the cavity has dimensions greater than or equal to dimensions of the membrane.

10. The method according to claim 1, wherein the first structural layer and the second structural layer are simultaneously etched so as to delimit the membrane and the rigidifying structure of the movable element.

11. The method according to claim 1, further comprising, after etching the second sacrificial layer and before etching the substrate:

arranging a cap on the second structural layer, thereby forming an assembly; and turning over the assembly.

12. The method according to claim 1, wherein the substrate is of silicon, the first sacrificial layer is of silicon oxide, and the first structural layer is of silicon.

13. The method according to claim 1, wherein the second sacrificial layer is of silicon oxide.

14. The method according to claim 1, wherein the first structural layer is formed by epitaxy on the first sacrificial layer.

15. The method according to claim 1, wherein forming the first structural layer comprises:

providing a transfer substrate comprising the first structural layer;

bonding the first structural layer of the transfer substrate to the first sacrificial layer;

thinning the transfer substrate until the first structural layer is reached.

16. The method according to claim 15, wherein the transfer substrate is a multilayer silicon-on-insulator type structure.

17. An electroacoustic transducer comprising:

a frame;

an element movable relative to the frame, the movable element comprising a membrane and a membrane rigidifying structure;

a first transmission arm, the movable element being coupled to one end of the first transmission arm;

the membrane being formed by a first part of a first structural layer, the rigidifying structure being formed by a first part of a second structural layer arranged on the first structural layer, and the frame comprising a substrate, a second part of the first structural layer and a second part of the second structural layer, in which electroacoustic transducer a distance between the substrate and a peripheral portion of the membrane is greater than the distance between the substrate and the second part of the first structural layer.

18. The electroacoustic transducer according to claim 17, wherein the substrate comprises a cavity arranged facing the peripheral portion of the membrane.

* * * * *